United States Patent
Vardeny et al.

(10) Patent No.: US 6,211,524 B1
(45) Date of Patent: Apr. 3, 2001

(54) ENHANCED RADIATION DETECTORS USING LUMINESCENT MATERIALS

(75) Inventors: Zeev V. Vardeny, Holladay, UT (US); Stefan A. Jeglinski, Durham, NC (US); Paul A. Lane, Sheffield (GB)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 09/061,330

(22) Filed: Apr. 17, 1998

Related U.S. Application Data

(60) Provisional application No. 60/044,636, filed on Apr. 18, 1997.

(51) Int. Cl.[7] .......................................................... G01J 1/58
(52) U.S. Cl. .......................................... 250/458.1; 356/417
(58) Field of Search ............................... 250/458.1, 483.1, 250/486.1, 487.1, 372 R, 373, 372 EM; 356/414, 417, 317

(56) References Cited

U.S. PATENT DOCUMENTS

| | | | |
|---|---|---|---|
| 4,015,130 | 3/1977 | Landry et al. | 250/372 |
| 4,061,922 | 12/1977 | Last | 250/461 |
| 4,096,387 | 6/1978 | Buckley | 250/372 |
| 4,201,916 | 5/1980 | Ellner | 250/372 |
| 4,241,258 | 12/1980 | Cholin | 250/372 |
| 4,262,206 | 4/1981 | Viehmann | 250/483 |
| 4,371,897 | 2/1983 | Kramer | 358/294 |
| 4,403,826 | 9/1983 | Presby | 350/96.3 |
| 4,452,720 | 6/1984 | Harada et al. | 252/301.16 |
| 4,467,208 | 8/1984 | Muller et al. | 250/483.1 |
| 4,731,881 | 3/1988 | Geller | 455/619 |
| 4,764,984 | 8/1988 | Franke et al. | 455/619 |
| 4,818,491 | 4/1989 | Faris | 422/56 |
| 4,904,876 | 2/1990 | Nobbs et al. | 250/461.1 |
| 4,916,319 | 4/1990 | Telfair et al. | 250/461.1 |
| 4,935,631 | 6/1990 | Mosley et al. | 250/458.1 |
| 5,039,854 | 8/1991 | Yip et al. | 250/327.2 |
| 5,055,737 * | 10/1991 | Murata et al. | 250/483.1 |
| 5,058,975 | 10/1991 | Sudo | 385/24 |
| 5,079,429 | 1/1992 | Tanaka et al. | 250/461.1 |
| 5,115,138 | 5/1992 | Tanaka et al. | 250/485.1 |
| 5,132,530 | 7/1992 | Groh et al. | 250/227.31 |
| 5,196,705 | 3/1993 | Ryan | 240/372 |
| 5,281,820 | 1/1994 | Groh et al. | 250/368 |
| 5,331,168 | 7/1994 | Beaubien et al. | 250/372 |
| 5,378,896 | 1/1995 | Knjaschewitsch et al. | 250/474.1 |
| 5,557,415 * | 9/1996 | Nielsen et al. | 250/458.1 |
| 5,568,304 | 10/1996 | Baur | 359/189 |
| 5,574,286 | 11/1996 | Huston et al. | 250/372 |
| 5,585,915 | 12/1996 | Kurosawa et al. | 356/218 |
| 5,718,842 * | 2/1998 | Papkovsky | 252/301.16 |

OTHER PUBLICATIONS

Garbuzov et al, "Organic Films Deposited on Si p–n junctions: Accurate Measurements of Fluorescence Internal Efficiency, and Application to Luminescent Antireflection Coatings", Journal of Applied Physics, dated Oct. 15, 1996, vol. 80, pp. 4644–4648.

(List continued on next page.)

Primary Examiner—Seungsook Ham
Assistant Examiner—Richard Hanig
(74) Attorney, Agent, or Firm—Randall W. Chang; William C. Daubenspeck; Paul A. Gottlieb

(57) ABSTRACT

A radiation detecting device comprising a radiation sensing element, and a layer of luminescent material to expand the range of wavelengths over which the sensing element can efficiently detect radiation. The luminescent material being selected to absorb radiation at selected wavelengths, causing the luminescent material to luminesce, and the luminescent radiation being detected by the sensing element. Radiation sensing elements include photodiodes (singly and in arrays), CCD arrays, IR detectors and photomultiplier tubes. Luminescent materials include polymers, oligomers, copolymers and porphyrines, Luminescent layers include thin films, thicker layers, and liquid polymers.

40 Claims, 6 Drawing Sheets

OTHER PUBLICATIONS

Gustafsson et al, "Flexible Light–Emitting Diodes made from Soluble Conducting Polymers", Nature, vol. 357, 1992, pp. 477–479.

D.D.C. Bradley,. "Conjugated Polymer Electroluminescence", Synth. Met. 64, 1993, pp. 401–415.

Grem et.al.,. "Realization of a Blue–Light–Emitting Device using Poly(p–phenylene)", Advanced Materials 4, 1992, pp. 36–38.

R. Wayant and M. Ediger, "Electro–Optics Handbook," McGraw–Hill 1994, p. 15.1.

C.I. Coleman and A. Boksenberg, "Image Intensifiers", Contemp. Phys 17, 1976, p. 209–236.

F.S. Johnson et.al., "Fluorescent Sensitized Photomultipliers for HeteroChromatic Photometry in the Ultraviolet," J. Opt. Soc. Am. 41, 1951, pp. 702–708.

R.S. Popovic et.al., "A Silicon Ultraviolet Detector," Sensors and Actuators A21–A23, 1990, pp. 553–558.

J.C. Larrabee et.al., "Detectivity of a UV–B Photodiode", SPIE "Ultraviolet Technology V", 1994, vol. 2282, pp. 297–230.

M.A. Kahn et.al., "High–responsivity Photoconductive Ultrviolet Sensors Based on Insulating GaN Epilayers," Appl.Phys. Lett. 60, 1992, pp. 2917–2919.

M. Marchywka et.al., "Recent Results in Diamond UV Detector Research", SPIE "Ultraviolet Technology V", 1994, vol. 2282, pp. 20–30.

N. Kristianpoller and D. Dutton, "Optical Properties of 'Liumogen': A Phosphor for Wavelength Conversion," Appl. Optics 3, 1964, pp. 287–290.

H. Nanto et.al., "Two–dimensional ultraviolet–ray sensor utilizing photostimulated luminescence in Eu–doped KCI phosphors", SPIE "X–ray and UV Detectors", vol. 2278, 1994, pp. 108–117.

P.F. Morrissey, et.al.,: "Vacuum–ultraviolet quantum efficiency of a phosphor–coated charge–coupled device", Appl. Optics 33, 1994, pp. 2534–2538.

G. Naletto, et.al.,: "Fluorescence of metachrome in the far and vacuum ultraviolet spectral region", SPIE vol. 2519, pp. 31–38.

M.A. Damento et.al.,: "Stability of Lumogen Films on CCDs", SPIE, Feb. 1997.

"Charge–Coupled Devices for Quantitative Electronic Imaging," Photometrics, Ltd., 3440 E. Britannia Dr., Tucson AZ 85706, 1992.

G. Yu et.al., "High–Sensitivity Photodetectors Made with Charge Transfer Polymer Blends", SPIE vol. 2999, 1997, pp. 306–314.

G. Yu et al., "Photosensitivity of MEH–PPV Sandwich Devices and Its Implication to Polymer Electronic Structure", Mol. Cryst. Liq. Cryst., vol. 256, 1994, pp. 543–548.

G. Y et al., "Dual Function Semiconducting Polymer Devices: Light–Emitting and Photodetecting Diodes", Applied Physics Letters 64 (12), Mar. 21, 1994, pp. 1540–1542.

* cited by examiner

ENHANCED RADIATION DETECTORS USING LUMINESCENT MATERIALS

CROSS-REFERENCE TO RELATED APPLICATIONS

This application claims the benefit of U.S. Provisional Application No. 60/044,636, filed Apr. 18, 1997.

STATEMENT OF GOVERNMENT INTEREST

The United States Government has rights in this invention pursuant to Grant No. FG03-93ER45490 between the U.S. Department of Energy and the University of Utah.

BACKGROUND OF THE INVENTION

The present invention relates generally to radiation detectors, and particularly to radiation detectors using radiation sensing elements whose range of detectable wavelengths has been enhanced via the presence of luminescent materials.

Description of Related Art

Conventional radiation detectors utilizing photodiodes are generally limited in the range of wavelengths that they can detect; for example conventional silicon photodiodes are not efficient in detecting ultraviolet (UV) rays, and germanium photodiodes are generally used in the infrared (IR) range. It would be highly desirable to be able to extend the range of photodiodes and other radiation sensing elements (such as charge-coupled device arrays (CCD), photomultiplier tubes (PMT) and IR detectors) to be able to detect wavelengths with greater efficiencies than their present capability.

U.S. Pat. No. 5,115,138 discloses a UV detecting device comprising an external light shielding means, a fluorescent member disposed in said external light shielding means, a light entrance means, a means to extract UV rays and guide said rays to said fluorescent member, and a photodiode. The fluorescent member upon absorption of the UV rays fluoresces, said fluorescent radiation being detected by the photodiode. It would be highly desirable to be able to eliminate the need for external shielding means and the means for extracting UV rays from the incident light. In addition the device according to U.S. Pat. No. 5,115,138 does not permit the determination of the wavelength of the radiation detected.

U.S. Pat. No. 5,196,705 discloses a luminescing dye contained in a sensing sheet which luminesces in response to incident UV light in a selected range, said luminescent light being detected by a sensor. However these materials are limiting because of the difficulty of forming luminescent dye materials into thin films, and by its self quenching properties.

SUMMARY OF THE INVENTION

An object of the present invention is to enhance the ability of radiation sensing elements, particularly photodiodes, to detect radiation of wavelengths at greater efficiencies than their present capability and eliminate the drawbacks encountered in the prior art described above. A further object is to provide a simple means to modify existing photodiodes in existing detector apparati thereby expanding their range of wavelength detection ability without having to replace the photodiodes.

This and other objects can be achieved according to the present invention by selection of a material chosen from a class of materials that luminesce upon absorption of radiation of the desired wavelength(s) to be detected. Such class of luminescent materials include polymers, oligomers, copolymers and porphyrines. These materials can be formed into thin films and are more stable in the UV range than other luminescent materials. The luminescent material is selected to be transparent to wavelengths longer than the desired wavelength(s) and will luminesce upon absorption of radiation at the desired wavelength(s). In the present invention, a layer of this material is interposed between a source of incident radiation and a radiation sensing element such as a photodiode. The incident radiation strikes the luminescent material layer. Certain wavelengths of radiation are transmitted through the luminescent material layer, and other wavelengths are absorbed by the luminescent material layer causing it to luminesce. The photodiode detects the luminescent radiation and incident radiation, registering a larger signal strength than would be measured by a photodiode without the luminescent layer present.

In a preferred embodiment, the radiation sensing element is a silicon photodiode and the luminescent material is a carbon backbone polymer. In a further preferred embodiment, the carbon backbone polymer is poly [2,7'-(9, 9-dioctylfluorene)]. The polymer is deposited as a film on the photodiode by means well known in the art. Incident radiation is shone directly onto the luminescent film. The resulting luminescent radiation and incident radiation is detected by the photodiode, indicating the presence of UV rays in the incident radiation.

In another embodiment, the photodiode is a germanium photodiode. The luminescent material is selected to absorb in the visible light region and luminesce in the IR region. The luminescent material may be selected from the group consisting of polythiophene, poly(paraphenylene vinylene) and poly (paraphenylene ethynylene).

In other embodiments, the radiation sensing elements may include CCD arrays or photomultiplier tubes.

In another embodiment, the luminescent material is a silicon backbone polymer.

Other embodiments include photodiode arrays, and use of polymers in liquid form.

BRIEF DESCRIPTION OF THE DRAWINGS

In the figures, like or similar elements (such as the photodiodes) utilize the same reference characters throughout the various views.

DETAILED DESCRIPTION OF THE INVENTION

Figure 1:
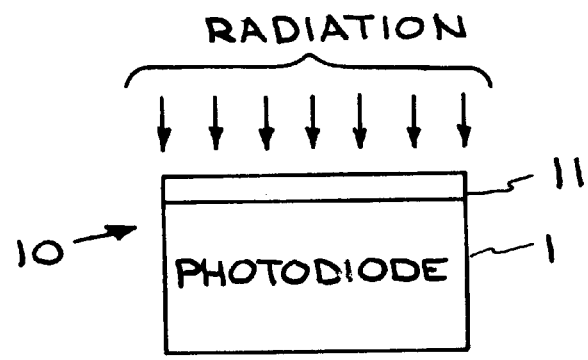
FIG. 1 illustrates an embodiment of the present invention comprising a photodiode and a luminescent material layer interposed between the photodiode and a source of incident radiation.

Abbreviations
HO-PPP—poly (2,5-diheptyloxy paraphenylene)
PPP—poly (paraphenylene)
PPV—poly (paraphenylene vinylene)
PPE—poly (paraphenylene ethynylene)
PPEV—poly (paraphenylene ethynylene vinylene)
$PF_8$—poly [2,7'-(9,9-dioctylfluorene)]
S-PPP—substituted poly (paraphenylene)
IR—Infrared
UV—Ultraviolet
CCD—charge-coupled-device A first embodiment according to the present invention is described hereunder with reference to FIG. 1.

Referring to FIG. 1, radiation detector 10 comprises a photodiode 1 and a luminescent material layer 11 interposed between the photodiode 1 and a source of incident radiation. The luminescent material is selected to absorb radiation at a selected wavelength, and is transparent to radiation at wavelengths longer than the selected wavelength. Upon absorption of the radiation, the luminescent material luminesces, said luminescent radiation being detected by the photodiode 1.

Figure 2:
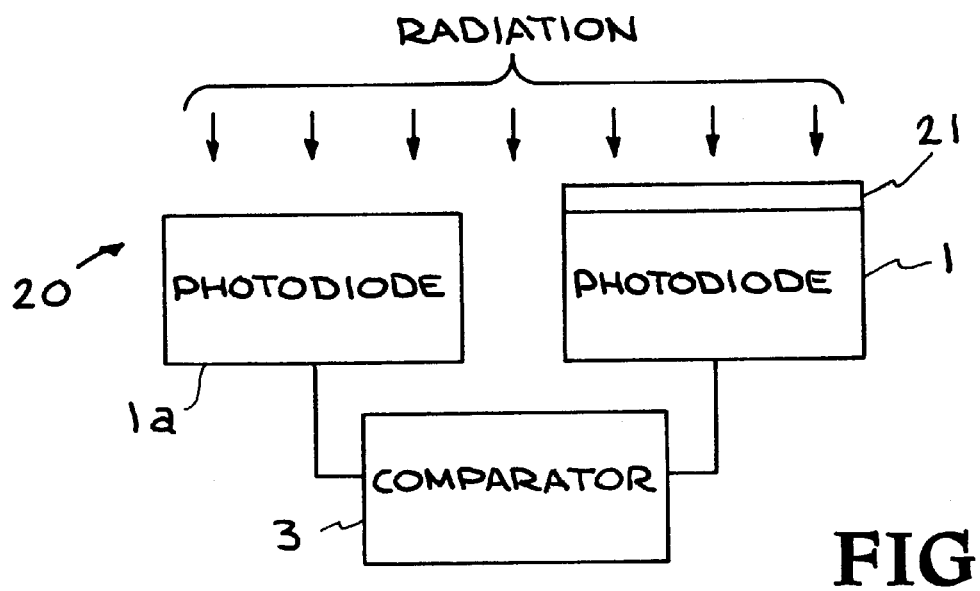
FIG. 2 illustrates a means of detecting the presence of radiation at particular wave lengths utilizing the embodiment of FIG. 1 whereby the signals from a photodiode with the luminescent material layer is compared to that from a photodiode without the luminescent material layer.

A second embodiment according to the present invention is described hereunder with reference to FIG. 2.

Referring to FIG. 2, radiation detector system 20 comprises a first photodiode 1 with a luminescent material layer 21 interposed between the photodiode 1 and a source of incident radiation, and a photodiode 1a which does not have a luminescent material layer. Said luminescent material 21 is selected to absorb radiation at a selected wavelength, and is transparent to radiation at wavelengths longer than the selected wavelength. Upon absorption of the radiation, said luminescent material 21 luminesces, said luminescent radiation being detected by the photodiode 1. The signals registered by photodiodes 1 and 1a are compared in comparator 3, wherein a difference in signals denotes presence of radiation at the selected wavelength.

Figure 3:
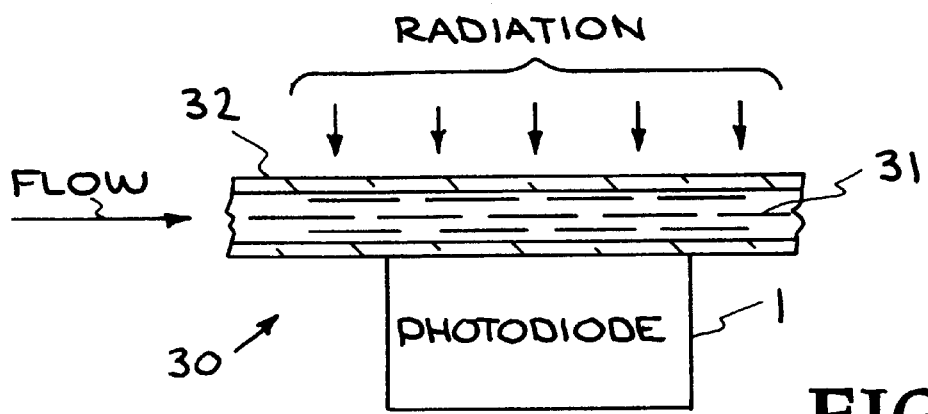
FIG. 3 illustrates an embodiment where the luminescent material is a liquid polymer.

A third embodiment according to the present invention is described hereunder with reference to FIG. 3.

Referring to FIG. 3, radiation detector 30 comprises a photodiode 1 and a luminescent material layer 31 interposed between the photodiode 1 and a source of incident radiation. Luminescent material layer 31 is a liquid polymer. Luminescent material layer 31 is contained in a transparent casing 32. Use of polymers in liquid form enables utilization of certain polymers that would normally degrade in the presence of oxygen or other gases. In addition, polymers degrade more quickly in high radiation level applications, such as in the UV region. In a further embodiment, transparent casing 32 contains inlet and outlet ports to allow replenishment of the liquid polymer. Thus polymers that have been degraded can be replaced by fresh polymer.

Figure 4:
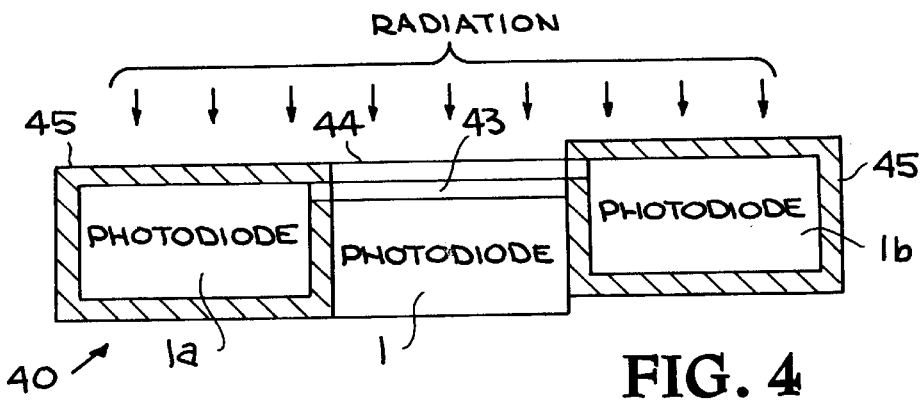
FIG. 4 illustrates an embodiment utilizing multiple photodiodes and luminescent material layers permitting determination of the wavelength(s) of radiation absorbed by the luminescent layers.

A fourth embodiment according to the present invention is described hereunder with reference to FIG. 4.

Referring to FIG. 4, radiation detector 40 comprises a photodiode 1, a luminescent material layer 43 interposed between the photodiode 1 and a source of incident radiation, a second photodiode 1a adjacent to the luminescent material layer 43 and means to shield 45 the second photodiode 1a from the incident radiation. The second photodiode 1a registers only luminescent radiation resulting from absorption of radiation by the luminescent material layer 43 where the luminescent radiation is directed to second photodiode 1a via wave guide action in the luminescent material layer 43. In a further embodiment, the radiation detector 40 may further comprise additional pairs of luminescent material layer and photodiode (e.g. 44 and 1b, respectively) to detect additional wavelengths of incident radiation. Having multiple pairs of luminescent material layer and photodiode stacked in this fashion as a sandwich allows one to detect a range of wavelengths simultaneously.

Figure 5:
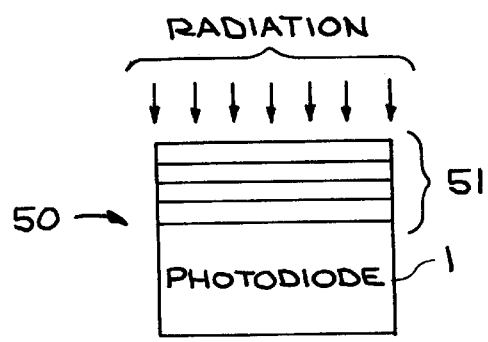
FIG. 5 illustrates another embodiment enabling determination of the wavelength(s) of radiation absorbed by the luminescent layers.

A fifth embodiment according to the present invention is described hereunder with reference to FIG. 5.

Referring to FIG. 5, radiation detector 50 comprises a photodiode 1, and a plurality of material layers (collectively denoted 51) interposed between said photodiode and a source of incident radiation. The material layer immediately adjacent to the photodiode 50 is a polymer which absorbs in the desired wavelength spectrum and luminesces. The other material layers are chosen so as to form an interference filter so that only the select wavelength is directed to the luminescent material layer. The material layers forming the interference filter may be polymer or non polymer materials. Another embodiment has one of the non luminescing material layers being a protective layer to protect the luminescent polymer layer. In a further embodiment, the protective layer is formed from a non polymer material, such as thin sapphire. Protective layers formed from thin sapphire are transparent in the IR, visible and UV spectrum. Another embodiment includes tailoring the outermost (closest to the incident radiation source) material layer's spectral absorptance and IR emittance. This allows measuring of high energy wavelengths such as in the UV region, while allowing rejecting of the absorbed energy as IR energy to maintain proper temperature of the detector. This tailored outermost layer could be formed from polymer and non-polymer materials.

Figure 6:
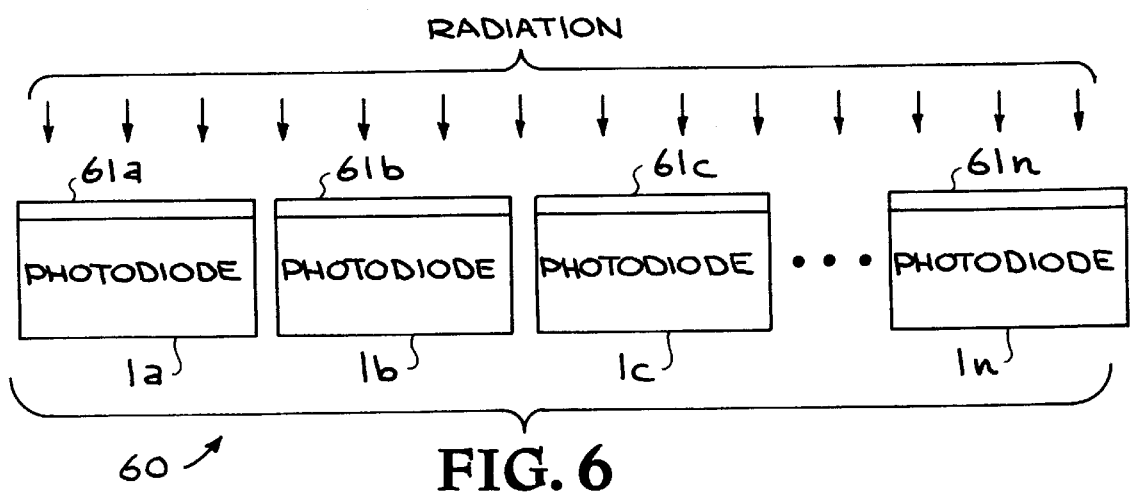
FIG. 6 illustrates an embodiment comprising an array of photodiodes each with a layer of luminescent material.
Figure 7:
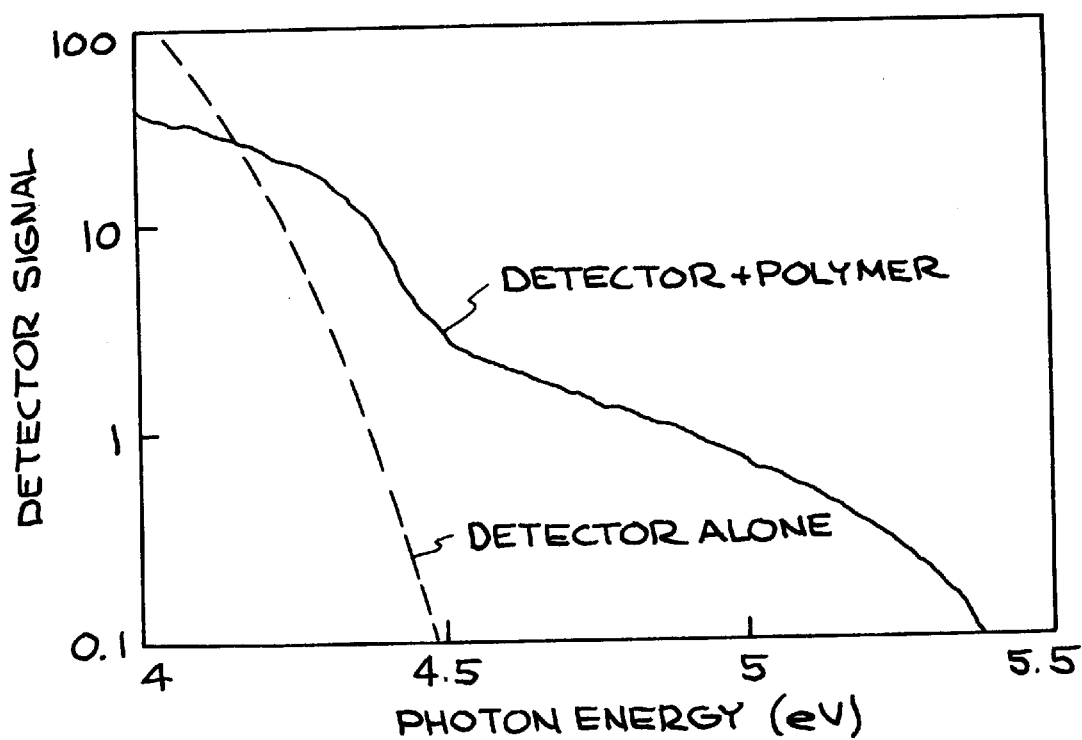
FIG. 7 illustrates enhancement of a silicon photodiode response in the present invention, using PPEV, which is a copolymer of PPE and PPV.
Figure 8:
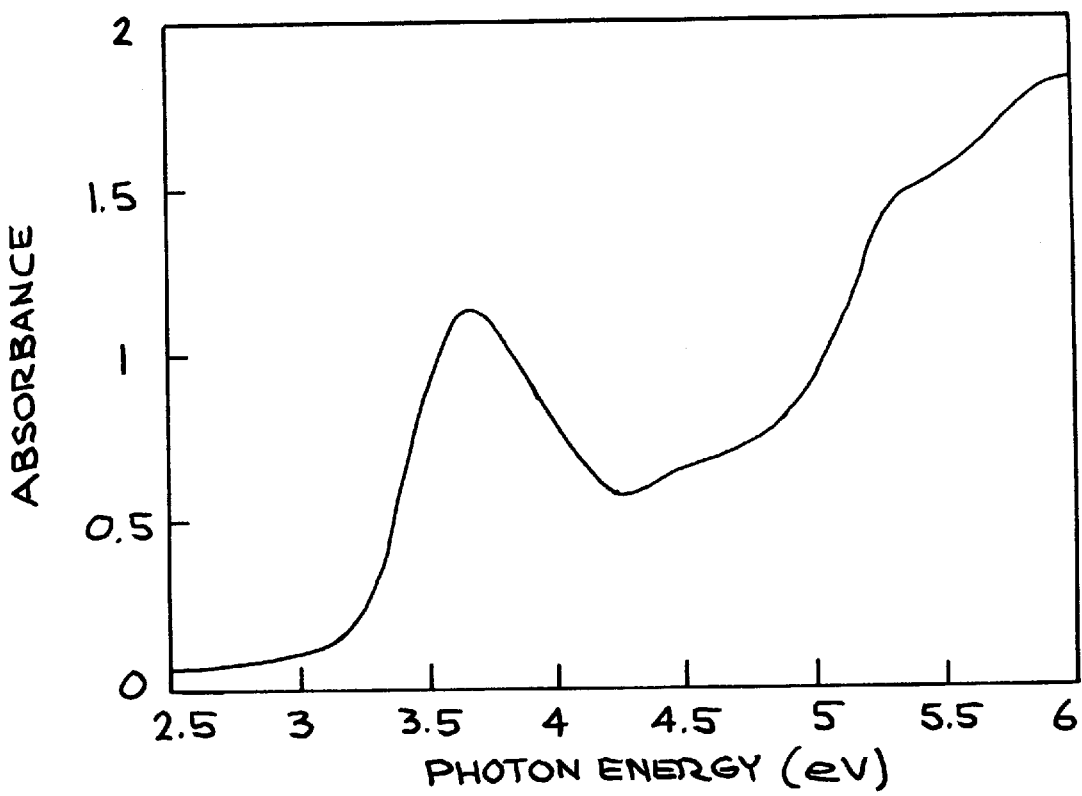
FIG. 8 illustrates the absorption spectrum for PPEV.
Figure 9:
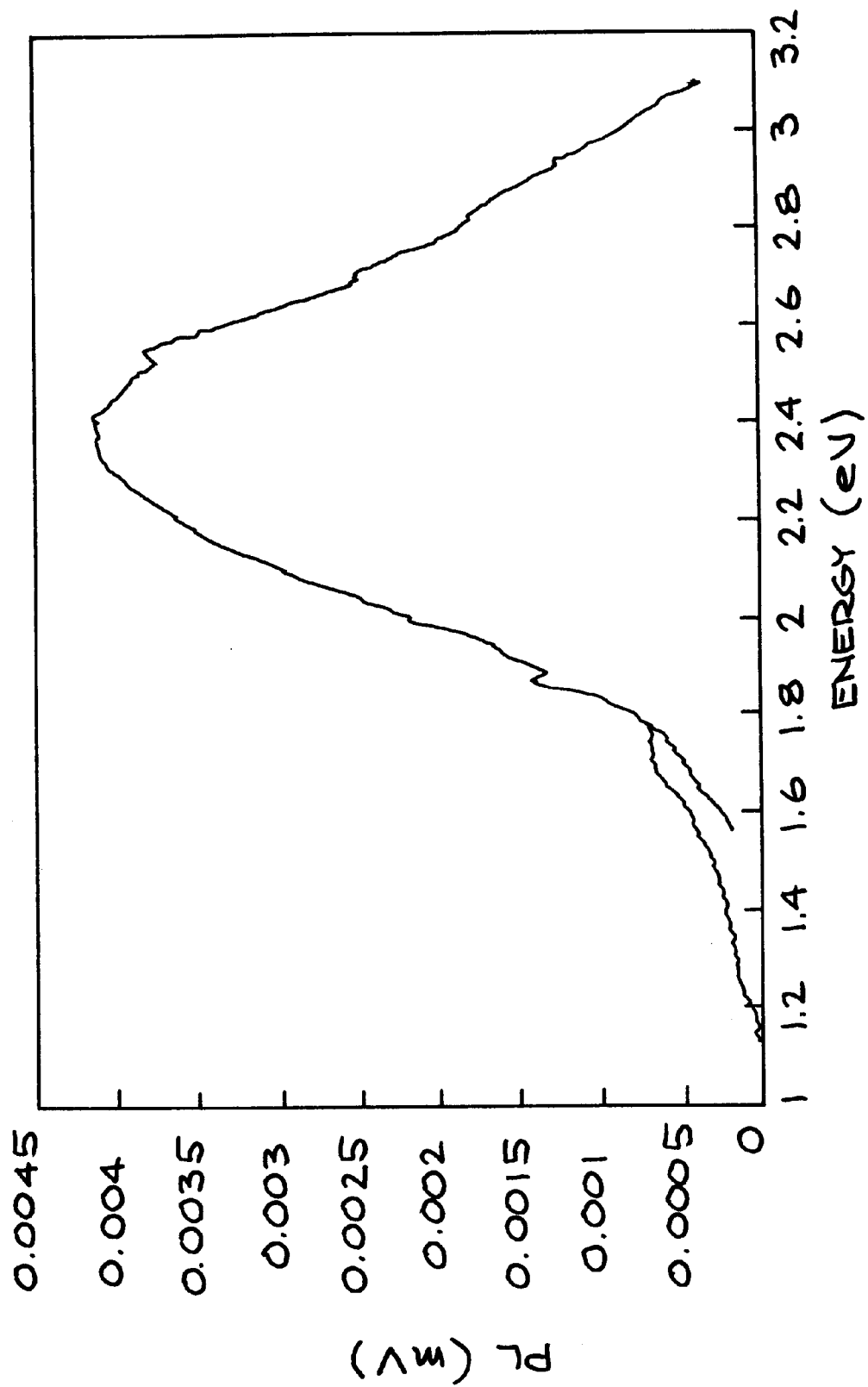
FIG. 9 illustrates the luminescence spectrum for PPEV.
Figure 10:
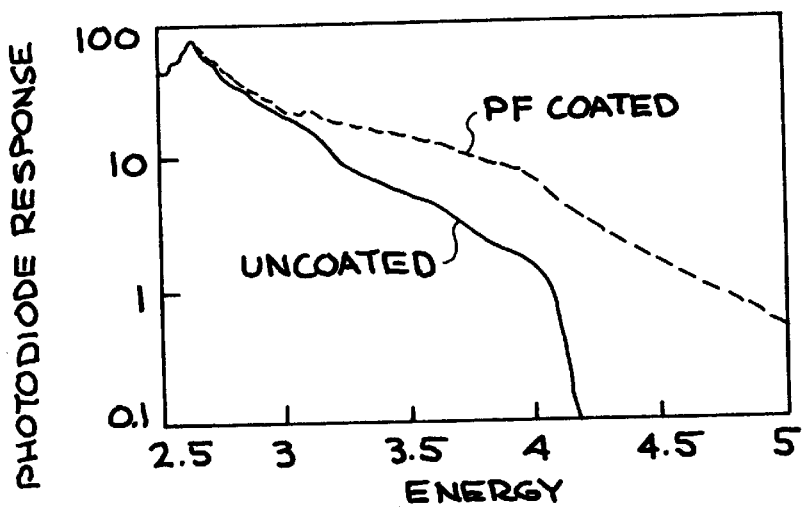
FIG. 10 illustrates enhancement of a silicon photodiode response in the present invention using poly [2,7'-(9,9-dioctylfluorene)], also called $PF_8$.
Figure 11:
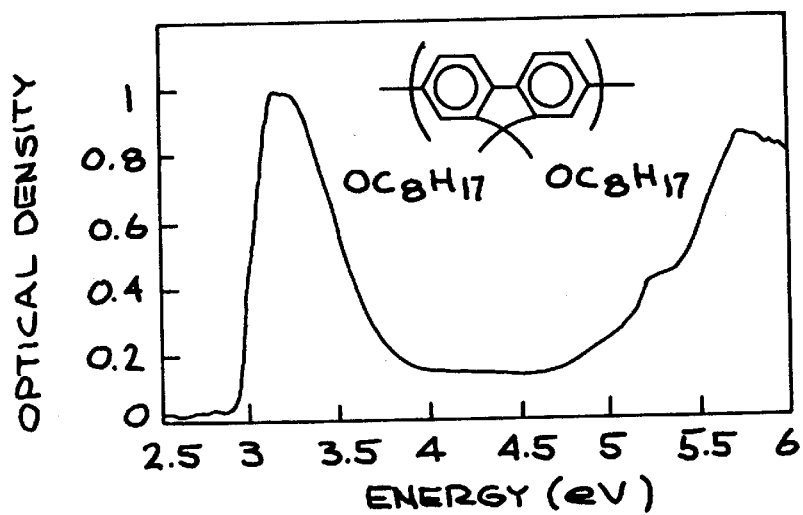
FIG. 11 illustrates the absorption spectrum of $PF_8$.
Figure 12:
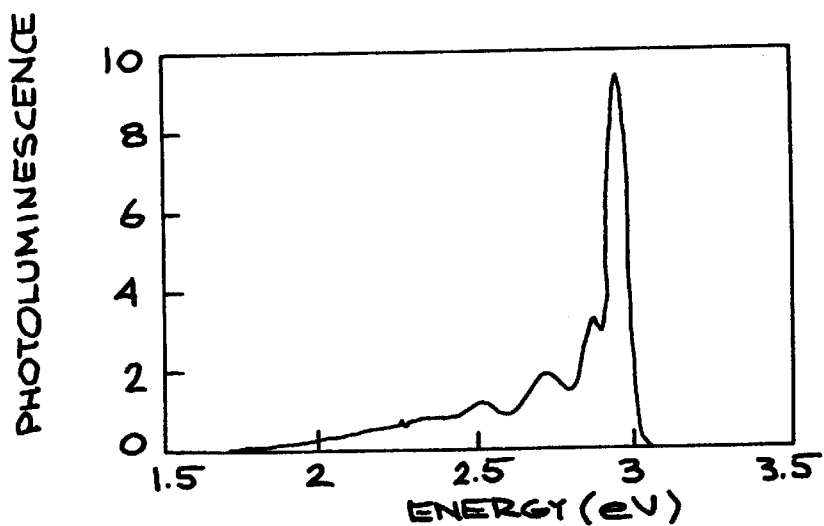
FIG. 12 illustrates the luminescence spectrum of $PF_8$.

A sixth embodiment according to the present invention is described hereunder with reference to FIG. 6.

Referring to FIG. 6, radiation detector array 60 comprises a plurality of photodiodes 1a, 1b, 1c, . . . 1n, etc. each having a luminescent material layer 61a, 61b, 61c, . . . 61n, etc. respectively, interposed between the photodiode and a source of incident radiation. Each luminescent material layer may be selected to absorb at a different selected wavelength. This allows the array to read a spectrum of wavelengths simultaneously, enabling elimination of a dispersive element commonly required in spectroscopy. Another embodiment utilizing a photodiode array is where each photodiode has a film of the same luminescent material. This provides an overall enhancement of the efficiency of the array, particularly useful in applications such as position and motion sensing. Instead of a photodiode array, a CCD array could be used with a film of luminescent material applied. This enhances the radiation detection efficiency and imaging capability of CCD arrays over a wider spectrum, such as in the UV region.

Figure 13:
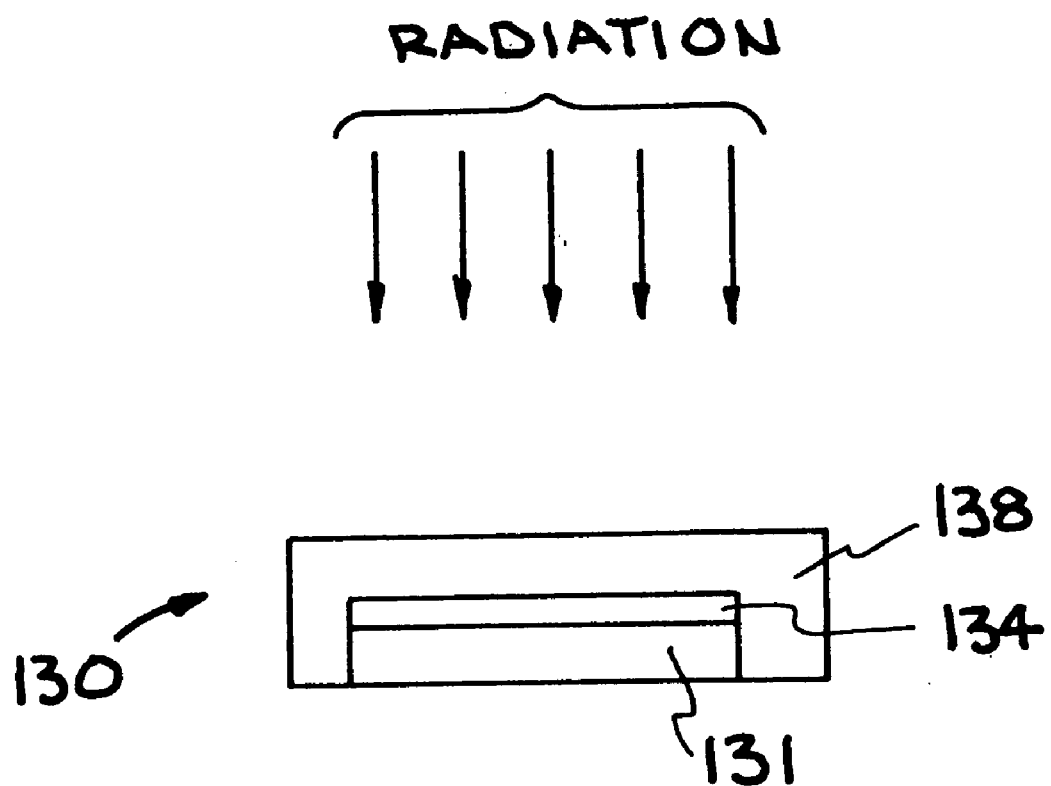
FIG. 13 illustrates an embodiment comprising encapsulating the radiation sensing element and layer of luminescent material to guide the emitted luminescent radiation to the radiation sensing element and to mitigate undesirable refraction of said luminescent radiation.

A seventh embodiment according to the present invention is described hereunder with reference to FIG. 13. Referring to FIG. 13, radiation detector 130 comprises a photodiode 131 and a luminescent material layer 134 interposed between the photodiode 131 and a source of incident radiation. Photodiode 131 and 134 are encapsulated in material 138. In this embodiment, the radiation sensing element (photodiode 131) and luminescent material 134, preferably poly [2,7'-(9,9-dioctylfluorene)], are encapsulated in material 138, (preferably resin), to guide the luminescent radiation from the luminescent material to the radiation sensing element and to mitigate undesirable refraction of the luminescent radiation.

In the embodiments as illustrated in FIGS. 1–6, 13 the photodiodes may be solid state photodiodes, including semiconductor photodiodes. The radiation sensing elements are not limited to photodiodes; other elements may include CCD arrays, photomultiplier tubes, solid state infrared (IR) detectors, photovoltaic IR detectors and photoconductive IR detectors. In a preferred embodiments, the photodiodes are silicon photodiodes. The photodiodes could also include an avalanche photodiode. In another embodiment, the photodiode is a germanium photodiode. In this embodiment, the luminescent material is selected to absorb in the visible light region and luminesce in the near IR region. The luminescent material being selected from the group consisting of polythiophene, poly(paraphenylene vinylene) and poly(paraphenylene ethynylene).

In the embodiments as illustrated in FIGS. 1–6, 13 the luminescent material layers may be selected from the class of luminescent materials that include polymers, oligomers, copolymers and porphyrines. Polymers include those referred to as conducting polymers, pi-bonded conjugated polymers such as carbon backbone polymers, and sigma-bonded conjugated polymers called polysilanes such as silicon backbone polymers. In certain applications, silicon backbone polymers may be preferred because of the higher absorption in the UV range. In one embodiment, the polymer is a carbon backbone polymer. In a preferred embodiment, the carbon backbone polymer is poly(2,5-diheptyloxy-1,4-phenylene). In a most preferred embodiment, the carbon backbone polymer is poly [2,7'-(9,9-dioctylfluorene)].

In further embodiments, the pi-bonded conjugated polymer is selected from the group consisting of di-substituted polyacetylene, polyfluorene, and substituted poly(paraphenylene-vinylene). In certain applications, oligomers may be preferred because oligomers do not require polymerization. In still another embodiment, the luminescent material is a copolymer of di-substituted polyacetylene, polyfluorene, and substituted poly(paraphenylene-vinylene). In another embodiment, the polymer is a copolymer of sigma-bonded and pi-bonded conjugated polymers. In a yet further embodiment, said copolymer is poly(phenylene-ethynylene-silane).

In the embodiments as illustrated in FIGS. 1–6, 13 the luminescent material layers may be a thin film deposited on the radiation sensing element utilizing well known techniques including, but not limited to, spin casting, sputtering, chemical vapor deposition, and evaporation from solution. The luminescent material layers may also be thicker material layers as desired for the particular application. The layers may be formed directly onto the surface of the radiation sensing elements, or contained as separate elements interposed between the radiation sensing element and source of incident radiation. These luminescent material layers may be used in conjunction with other optical layers, films and coatings that are well known in the art to provide additional optical performance, such as thin sapphire windows to provide protection to the luminescent layer(s).

Obviously numerous modifications and variations of the present invention are possible in the light of the above teachings. It is therefore to be understood that within the scope of the appended claims the invention may be practiced otherwise than as specifically described therein.

What at is claimed is:

1. A radiation detector receiving incident radiation from a source, said radiation detector comprising:
    (a) a radiation sensing element;
    (b) a layer of luminescent material interposed between said radiation sensing element and said incident radiation source;
    (c) said luminescent material being selected from the group consisting of polymers, oligomers, and copolymers, wherein the active material in said luminescent material forms the backbone of the polymer, oligomer or copolymer chain or the active material is a sidegroup attached to the polymer, oligomer or copolymer chain;
    (d) said luminescent material being selected to absorb radiation at a selected range of absorbing wavelengths, to luminesce at a selected range of luminescing wavelengths, and to be transparent at wavelengths longer than said selected absorbing wavelengths;
    (e) and said luminescent radiation being detected by said radiation sensing element.

2. A radiation detector as recited in claim 1 wherein said polymer is selected from the group consisting of conducting polymers, pi-bonded conjugated polymers and sigma-bonded conjugated polymers.

3. A radiation detector as recited in claim 2 wherein said pi-bonded conjugated polymer is selected from the group consisting of di-substituted polyacetylene, polyfluorene, and substituted poly(phenylene-vinylene).

4. A radiation detector as recited in claim 2 wherein said pi-bonded conjugated polymer is a carbon backbone polymer.

5. A radiation detector as recited in claim 4 wherein said carbon backbone polymer is poly(2,5-diheptyloxy-1,4-phenylene).

6. A radiation detector as recited in claim 4 wherein said carbon backbone polymer is poly [2,7'-(9,9-dioctylfluorene)].

7. A radiation detector as recited in claim 2 wherein said sigma-bonded conjugated polymer is a silicon backbone polymer.

8. A radiation detector as recited in claim 1 wherein said polymer is selected from the group consisting of polythiophene, poly(paraphenylene vinylene) and poly(paraphenylene ethynylene).

9. A radiation detector as recited in claim 1 wherein said copolymer is selected from the group consisting of di-substituted polyacetylene, polyfluorene, and substituted poly(paraphenylene vinylene).

10. A radiation detector as recited in claim 1 wherein said copolymer is a copolymer of sigma- and pi-bonded conjugated polymers.

11. A radiation detector as recited in claim 1 wherein said copolymer is poly(phenylene ethynylene silane).

12. A radiation detector as recited in claim 1 wherein said radiation sensing element is selected from the group consisting of photodiodes, charge-coupled device (CCD) arrays, photomultiplier tubes, solid state infrared (IR) detectors, photovoltaic IR detectors and photoconductive IR detectors.

13. A radiation detector as recited in claim 12 wherein said photodiode is a solid state photodiode.

14. A radiation detector as recited in claim 13 wherein said solid state photodiode is a semiconductor photodiode.

15. A radiation detector as recited in claim 14 wherein said semiconductor photodiode is a silicon photodiode.

16. A radiation detector as recited in claim 14 wherein said semiconductor photodiode is an avalanche photodiode.

17. A radiation detector as recited in claim 14 wherein said semiconductor photodiode is a germanium photodiode.

18. A radiation detector as recited in claim 1 wherein said selected range of luminescing wavelengths is selected from the visible to infrared spectrum.

19. A radiation detector as recited in claim 1 wherein said selected range of absorbing wavelengths is selected from the ultraviolet to visible spectrum.

20. A radiation detector as recited in claim 1 wherein said luminescent material layer is a thin film deposited on said radiation sensing element.

21. A radiation detector as recited in claim 20 wherein said thin film is deposited via spin casting.

22. A radiation detector as recited in claim 20 wherein said thin film is deposited via sputtering.

23. A radiation detector as recited in claim 20 wherein said thin film is deposited via chemical vapor deposition.

24. A radiation detector as recited in claim 20 wherein said thin film is deposited via evaporation from solution.

25. A radiation detector as recited in claim 1, further comprising:
  (a) a transparent casing; said layer of luminescent material being contained within said transparent casing;
  (b) and wherein said layer of luminescent material is a liquid polymer.

26. A radiation detector as recited in claim 25, wherein said transparent casing has inlet and outlet ports for replenishment and removal of said liquid polymer.

27. A radiation detector as recited in claim 1, further comprising: means for encapsulating said radiation sensing element and said layer of luminescent material to guide said luminescent radiation to said radiation sensing element and to mitigate undesireable refraction of said luminescent radiation.

28. A radiation detector as recited in claim 27, wherein said encapsulating means comprises resin.

29. A radiation detector apparatus receiving incident radiation from a source, said radiation detector apparatus comprising:
  (a) first and second photodiodes;
  (b) a layer of luminescent material interposed between said first photodiode and said incident radiation source;
  (c) said luminescent material being selected from the group consisting of polymers, oligomers, and copolymers, wherein the active material in said luminescent material forms the backbone of the polymer, oligomer or copolymer chain or the active material is a sidegroup attached to the polymer, oligomer or copolymer chain;
  (d) said luminescent material being selected to absorb radiation at a selected range of absorbing wavelengths to luminesce at a selected range of luminescing wavelengths, and to be transparent at wavelengths longer than said selected absorbing wavelengths, said luminescent radiation being detected by said first photodiode;
  (e) and means for comparing the signals from said first and second photodiodes whereby a difference in signals denotes presence of radiation at the selected wavelength.

30. A radiation detector receiving incident radiation from a source, said radiation detector comprising:
  (a) first and second photodiodes;
  (b) a detecting layer interposed between said first photodiode and said incident radiation source; said detecting layer comprising a layer of luminescent material, a second photodiode, and means to shield said second photodiode from said incident radiation;
  (c) said luminescent material being selected from the group consisting of polymers, oligomers, and copolymers, wherein the active material in said luminescent material forms the backbone of the polymer, oligomer or copolymer chain or the active material is a sidegroup attached to the polymer, oligomer or copolymer chain;
  (d) said luminescent material being selected to absorb radiation at a selected range of absorbing wavelengths, to luminesce at a selected range of luminescing wavelengths, and to be transparent at wavelengths longer than said selected absorbing wavelengths, said luminescent radiation being detected by said first photodiode;
  (e) and said second photodiode being disposed adjacent to said luminescent material layer to detect said luminescent radiation that has been directed to said second photodiode via wave guide action in said luminescent material layer.

31. A radiation detector as recited in claim 30, further comprising:
  (a) a plurality of additional luminescent material layers interposed between said first photodiode and said incident radiation source, wherein each additional luminescent material layer is selected to absorb and luminesce at a different wavelength;
  (b) and a plurality of additional photodiodes, with each said additional photodiode disposed adjacent to each said additional luminescent material layer to detect said luminescent radiation that has been directed to each said additional photodiode via wave guide action in each said additional luminescent material layer.

32. A radiation detector receiving incident radiation from a source, said radiation detector comprising:
  (a) a photodiode;
  (b) a plurality of material layers interposed between said photodiode and said source of incident radiation, said material layers having an innermost material layer (immediately adjacent to said photodiode) and outer material layers (not immediately adjacent to said photodiode);
  (c) the innermost material layer being a luminescent material selected to absorb radiation at a selected range of absorbing wavelengths, to luminesce at a selected range of luminescing wavelengths, and to be transparent at wavelengths longer than said selected absorbing wavelengths, said luminescent radiation being detected by said photodiode;
  (d) said luminescent material being selected from the group consisting of polymers, oligomers, and copolymers, wherein the active material in said luminescent material forms the backbone of the polymer, oligomer or copolymer chain or the active material is a sidegroup attached to the polymer, oligomer or copolymer chain;
  (e) and the outer material layers being selected to allow only radiation at the selected wavelength to be directed to said innermost material layer, said outer material layers serving as an interference filter.

33. A radiation detector as recited in claim 32, wherein said outer material layers are composed of polymer materials.

34. A radiation detector as recited in claim 32, wherein the outer material layer closest to said source of incident radiation has been selected to have high emittance in the infrared region.

35. A radiation detector as recited in claim 32, further comprising a protective material layer interposed between said interference filter and said source of incident radiation.

36. A radiation detector as recited in claim 35, wherein said protective material layer is a polymer material.

37. A radiation detector as recited in claim 35, wherein said protective material layer is sapphire.

38. A radiation detector array receiving incident radiation from a source, said radiation detector array comprising:
   (a) a plurality of photodiodes;
   (b) a plurality of luminescent material layers, each said luminescent material layer being interposed between each said photodiode and said incident radiation source;
   (c) said luminescent material being selected from the group consisting of polymers, oligomers, and copolymers, wherein the active material in said luminescent material forms the backbone of the polymer, oligomer or copolymer chain or the active material is a sidegroup attached to the polymer, oligomer or copolymer chain;
   (d) and said luminescent material layers being selected to absorb radiation at a selected range of absorbing wavelengths, to luminesce at a selected range of luminescing wavelengths, and to be transparent at wavelengths longer than said selected absorbing wavelengths, said luminescent radiation being detected by each said photodiode.

39. A radiation detector array as recited in claim 38, wherein each luminescent material layer absorbs at the same radiation wavelength.

40. A radiation detector array as recited in claim 38, wherein each luminescent material layer absorbs at a different radiation wavelength.

* * * * *